VAPOR DEPOSITION PROCESS

Original Filed Oct. 12, 1961

3 Sheets-Sheet 1

INVENTORS
James R. Black
Frederick L. Blake
BY Mueller & Aichele

INVENTORS.
James R. Black
Frederick L. Blake
BY Mueller & Aichele

VAPOR DEPOSITION PROCESS

Original Filed Oct. 12, 1961

3 Sheets-Sheet 3

INVENTORS
James R. Black
Frederick L. Blake
BY Mueller & Aichele 3,330,694

VAPOR DEPOSITION PROCESS

James R. Black, Phoenix, Ariz., and Frederick L. Blake, deceased, late of Scottsdale, Ariz., by Betty Ann Dickson, administratrix, Phoenix, Ariz., assignors to Motorola, Inc., Franklin Park, Ill., a corporation of Illinois Continuation of application Ser. No. 144,637, Oct. 12, 1961. This application July 14, 1965, Ser. No. 477,071

13 Claims. (Cl. 117—201)

This is a continuation of application Ser. No. 144,637, filed Oct. 12, 1961, and now abandoned.

This invention relates generally to the solid state electronics art and in particular relates to the formation of layers and coatings of glass and certain other materials for use in the fabrication and encapsulation of solid state electronic devices.

There are several ways in which films of inorganic glass material can be used advantageously in the solid state electronics art. For example, the semiconductor unit of an electronic device such as a transistor or diode can be protected from moisture and other impurities in its ambient by coating the surface of the semiconductor unit, particularly at exposed junctions, with inorganic glass material. The glass coating helps to stabilize the electrical characteristics of the electronic device.

A glass film can also be used for masking purposes in the fabrication of semiconductor devices by diffusion processing. If a semiconductor unit is coated with glass only at selected portions of its surface and is then heated in an atmosphere which contains a controlled amount of donor or acceptor impurity material in vapor form, the impurity material will diffuse into the semiconductor unit only at the places which are not covered by the glass coating. Such selective diffusion processing is useful in the formation of junctions in semiconductor units, and is well known in the art.

A glass film may also be used as a dielectric medium in a capacitor element. There has been a need for a practical way of making thin film capacitor elements which are part of an integrated circuit structure. Capacitance, resistance and inductance functions, together with conductive interconnections for a complete electronic circuit, can be provided by depositing thin films of materials on a single substrate, and such integrated circuit structures have great potential in the electronics art. A glass film can be applied over an entire integrated circuit structure for encapsulation purposes. Also, glass deposits can be used to provide cross-over insulation between two or more crossing conductors.

Although the merits of inorganic glass films for such applications have been recognized, known methods of forming them have not been entirely satisfactory. In general, it has been difficult to form glass films on semiconductor units and on substrates for integrated circuits at temperatures which are low enough to avoid permanently changing the physical and electrical characteristics of the materials on which the glass is formed. In certain known glass coating methods, the surface of the substrate material is actually converted to glass by thermal oxidation, and in some cases the temperature required for such oxidation is high enough to permanently change the electrical characteristics of the substrate material such that it will not meet the desired electrical specifications. Some other methods produce glasses, the melting temperature of which is lower than is desired for encapsulation purposes. Similar problems have been encountered in attempting to fabricate films of certain other materials, particularly ceramics such as titanates.

Accordingly, it is an object of this invention to provide a method of forming thin films of inorganic materials which have a high melting temperature, such as silicate glasses and ceramic materials, without exposing the substrate on which the film is formed to high temperatures.

Another object of the invention is to provide a method of coating a substrate with inorganic glass material which has a relatively high melting temperature while keeping the substrate relatively cool and without consuming the material of the substrate.

A specific object of the invention is to provide an improved method of depositing oxide materials on a substrate by pyrolysis of vapors.

A further object of the invention is to provide a capacitor element made entirely of thin films including a dielectric film of silicate glass, and a method of fabricating such a capacitor by pyrolysis of organic silicate materials.

A feature of the invention is the provision of a method of depositing materials from vapors onto a substrate by thermally decomposing or reacting vapors in a high temperature zone of a deposition system, and then causing the reaction products to flow to a cooler zone of the system where one of the reaction products having a low vapor pressure deposits on the substrate. Using this method, organic silicate materials can be thermally decomposed in a hot zone to form silica vapors, and the silica can be deposited on a substrate in a cooler zone to form a continuous glass coating or film on the substrate while keeping it relatively cool.

Another feature of the invention is the provision of a pyrolytic deposition process for forming glass coatings or layers employing organic silicate materials which can be decomposed by heat to form silicon dioxide without causing any side reaction which would interfere with the deposition of silicon dioxide on a substrate.

Another feature of the invention is the provision of capacitor elements for microminiature circuit assemblies which are composed entirely of thin films including a dielectric film of silicate glass, and a method of forming such thin film capacitors by alternately depositing metallic material and silicon dioxide material on a substrate.

The invention is illustrated in the accompanying drawings in which.

Figure 1:
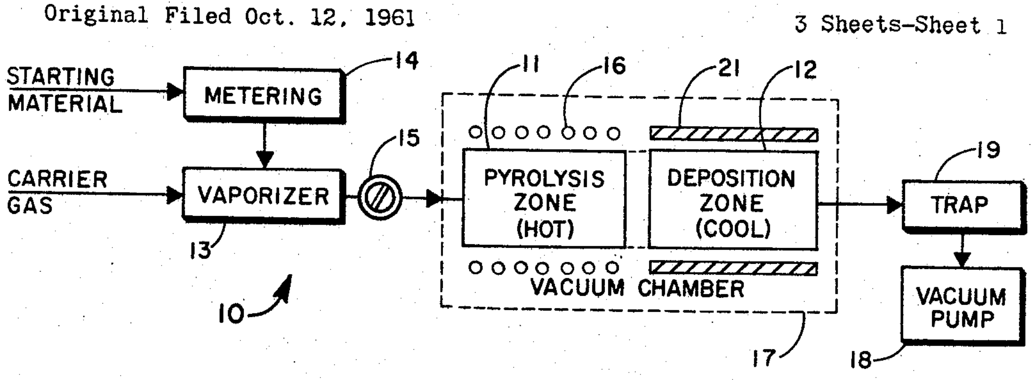
FIG. 1 is a schematic diagram of a pyrolysis system for making glass films by the method of the invention.
Figure 3:
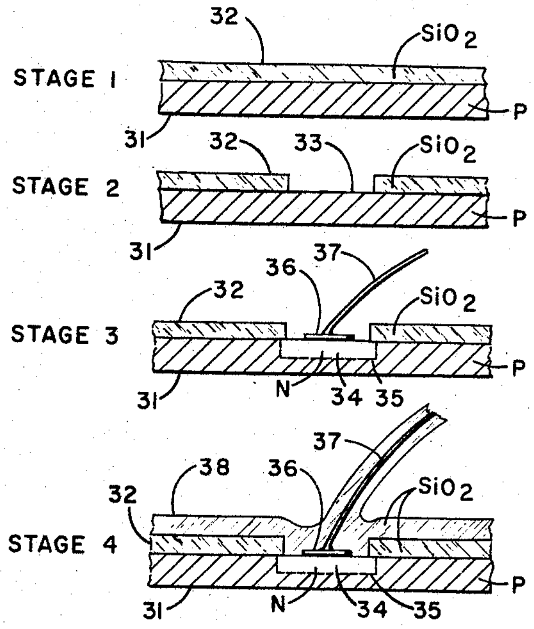
Figure 4:
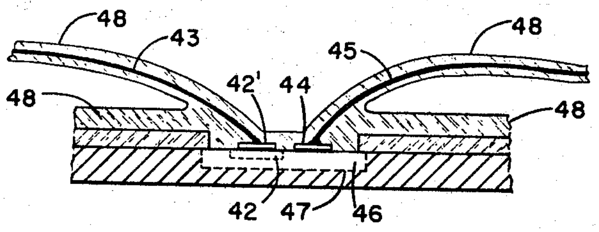
Figure 5:
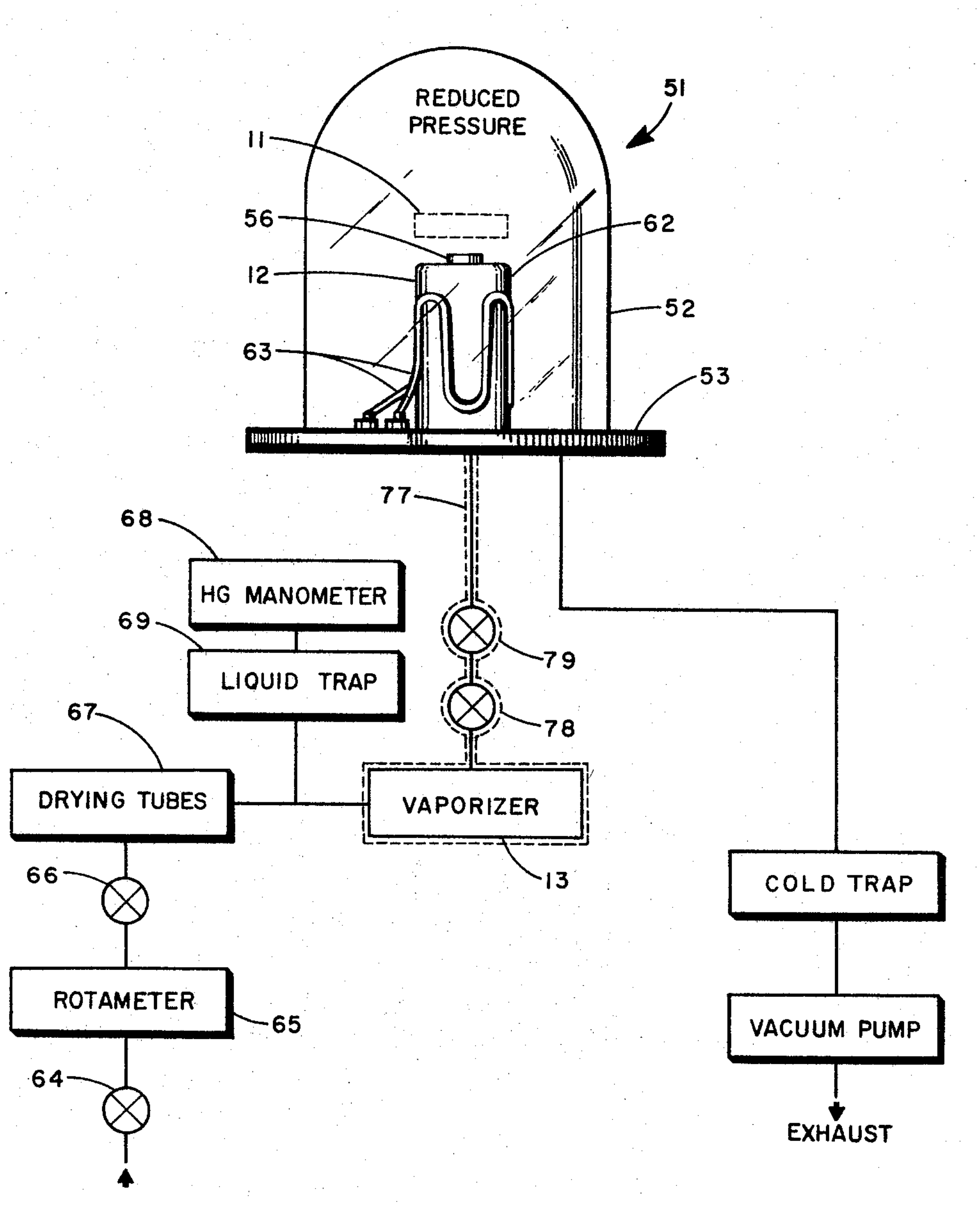
Figure 6:
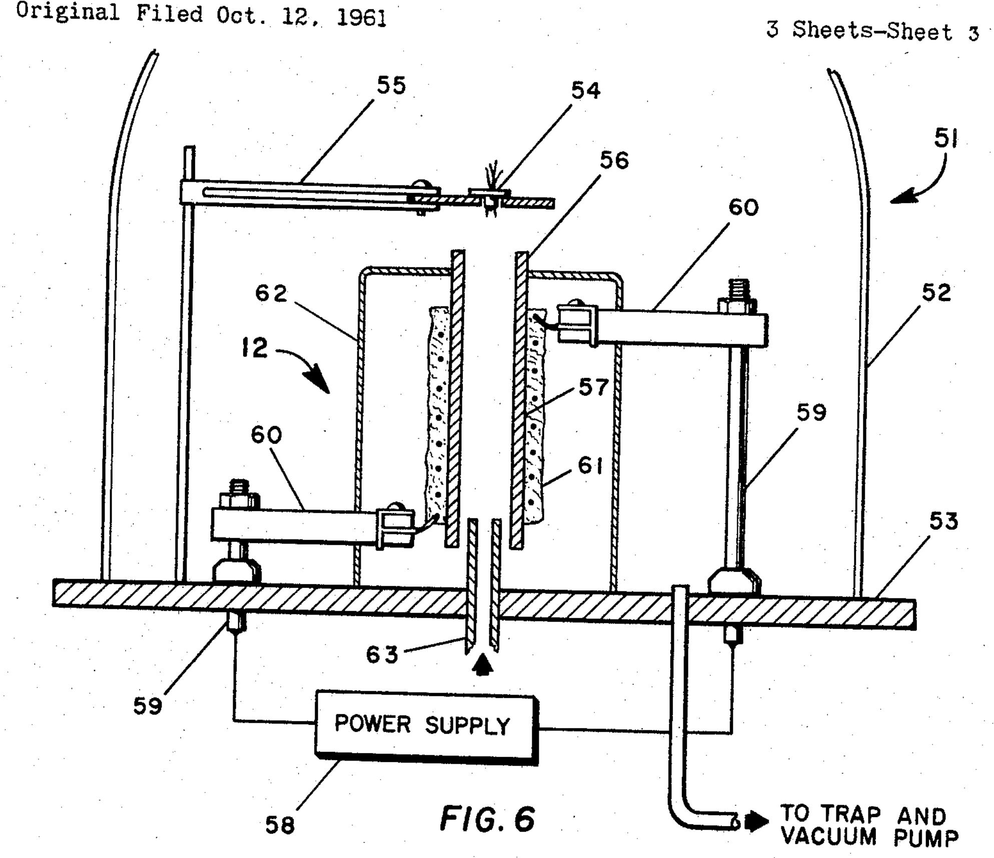
Figure 7:
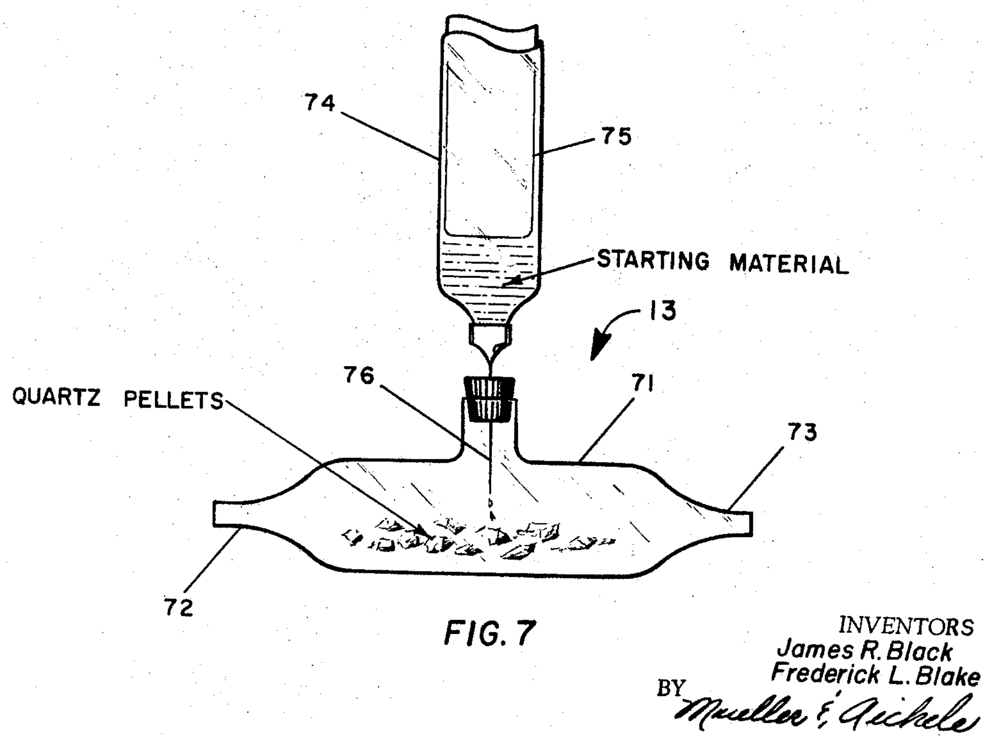

FIG. 3 will be described in explaining how a glass film may be employed as a mask in the diffusion processing of semiconductor material, and shows the work at several stages of the processing;

FIG. 4 is a schematic view of a semiconductor unit which has a silicate glass coating on it;

FIG. 5 is a partly structural and partly schematic view which further illustrates the system of FIG. 1;

FIG. 6 is a cross sectional view of apparatus provided with a hot zone for reacting vapors and a cooler zone for deposition of a product of the reaction on a substrate; and FIG. 7 illustrates suitable structure for vaporizing organic silicate materials which are employed in certain applications of the invention.

The general nature of the process of the invention will be described first, with reference primarily to FIG. 1. Examples of specific applications of the process to the fabrication of solid state electronic devices will then be described with reference to FIGS. 2, 3 and 4, and suitable apparatus for carrying out the process will be described with reference to FIGS. 5, 6 and 7.

FIG. 1 schematically illustrates a system for depositing materials from vapors onto a substrate by a pyrolytic process. A key feature of this process is the thermal separation of the pyrolysis and deposition phases. As illustrated in FIG. 1, vapors are decomposed by heat in a hot zone or region 11, and the decomposition products then flow to a cooler zone 12 where the desired coating material deposits on a substrate. Because of the thermal separation between the pyrolysis zone 11 and the deposition zone 12, the substrate is not subjected to the high temperatures which are typically required for pyrolysis of certain organo-metallic vapors. This is particularly important in the fabrication of integrated circuit structures, semiconductor devices and other solid state products because the physical and electrical characteristics of such electronic substrates are often permanently changed if the substrate is heated to the temperatures required for this type of pyrolysis. The separation of the pyrolysis step from the deposition step makes it possible to keep the substrate relatively cool while material is deposited on it.

The double zone deposition process of the invention is particularly suited for forming silica glass coatings or layers, and it can be used for depositing other inorganic materials which as metals, metal oxides, and oxide-modified silica glasses. Although pyrolysis of vapors, wherein the vapors are simply decomposed by heat to produce a desired product, is a major application for the process of the invention, it is possible to induce a chemical reaction between different vapor materials or gases in the hot zone 11 to form an inorganic coating material which has a lower vapor pressure than the original vapors and organic by-products of the reaction. Then the coating material deposits on a substrate in the cool zone 12.

The starting material for forming glass films is an organic-silicate compound which can be decomposed by heat to form silicon dioxide. The silicon dioxide deposits on the substrate and forms a continuous glass film which can be used for encapsulation purposes or for device fabrication purposes as will be described further. The organic-silicate compound must be one which is volatile and which can be pyrolyzed at moderate temperatures. It is necessary to carry out the pyrolysis and deposition steps in a dry atmosphere because silicon dioxide may be hydrated by water vapor, and this will prevent the formation of an acceptable glass film. Consequently, the selection of a starting material must be made on the basis that water vapor is not formed as a by-product when the organic-silicate material is pyrolyzed.

Up to the present time, the best results have been obtained using tetramethylorthosilicate as the starting material. Satisfactory glass films for some applications have also been formed using dibenzyldiethylorthosilicate and diethyldimethylorthosilicate as the starting material. These materials are all volatile and can be readily pyrolyzed. They do not form water vapor as a by-product of the pyrolysis reaction, and this is believed to be due to the fact that at least two of the ester groups of each of these materials have no hydrogen atom beta to the oxygen linkage. Silicon orth-esters which have 3 or 4 hydrogen atoms beta to the oxygen linkage will form water as a by-product of the pyrolysis.

The organic silicate material is initially in liquid form, and is vaporized into a carrier gas in a vaporizer 13. The amount of the silicate material which is introduced into the carrier gas is metered at 14 to control the flow of silicate material into the vaporizer 13. The carrier gas containing silicate vapors flows from the vaporizer 13 through a valve 15 into the pyrolysis zone 11. A suitable heater 16 is provided at the pyrolysis zone, and the temperature is maintained above the decomposition temperature of the organic silicate material. The organic silicate vapors decompose in the pyrolysis zone to form silicon dioxide which is carried with the gas stream to the deposition zone 12 and deposits on the substrate in that zone.

If the gases are heated by contact with a hot surface in the pyrolysis zone 11, it is desirable to have a relatively high velocity flow of gas through the pyrolysis zone in order to keep the silicon dioxide from depositing on the surface of the heater. Also, it is desirable to maintain both the pyrolysis zone 11 and the deposition zone 12 at a reduced pressure in order to prevent condensation of organic by-products of the pyrolysis on the substrate along with the glass forming materials. Therefore, both the pyrolysis zone 11 and the deposition zone 12 are provided in a vacuum chamber 17 which is typically evacuated to a pressure of about three to five millimeters of mercury. The reduced pressure is established by means of a vacuum pump 18. A condensation trap 19 is provided in the line leading to the vacuum pump in order to remove organic by-product vapors from the atmosphere which is withdrawn from the vacuum chamber by the pump. A suitable cooling system 21 may be provided in the deposition zone 12 for the purpose of keeping the substrate cool, although the physical separation of the substrate from the hot pyrolysis zone provides a sufficient temperature differential for most applications.

Figure 2:
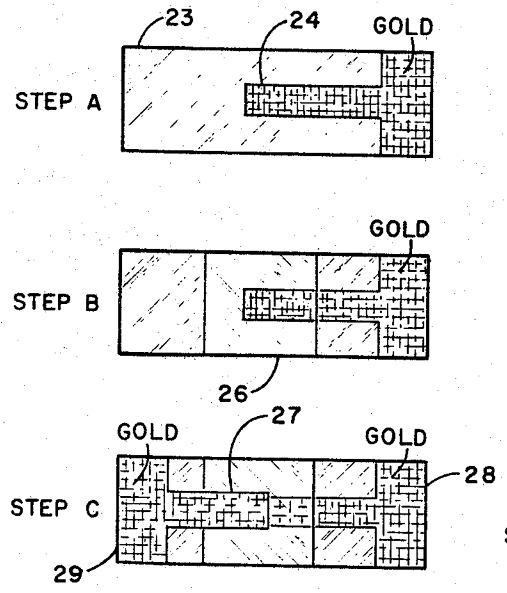
FIG. 2 illustrates the steps of a method of forming a thin film capacitor element in accordance with the invention and shows the condition of the work at three stages of the processing.

FIG. 2 illustrates the steps of fabricating a thin film capacitor by the double zone deposition process described above. In step A, gold material is vacuum deposited onto an insulating substrate 23 to form a thin film of gold 24 which serves as an electrode. The shape of the electrode film 24 is not critical, and that shown in FIG. 2 is intended to be illustrative only. In step B of the process as shown in FIG. 2, a thin film of glass 26 is formed over the gold electrode 24, and this glass film provides the dielectric material of the capacitor. The glass film 26 is formed as described above in connection with FIG. 1. In step C, gold material is vacuum deposited on the glass film 26 to form a counter electrode 27. Electrical connections may be made to the electrode 24 and to the counter electrode 27 at the enlarged areas of gold material at 28 and 29. Thin film capacitors of this type can be formed on a substrate which already has other circuit elements on it without changing the physical and electrical characteristics of those circuit elements, and this is possible because the double zone process for depositing the glass does not require excessive heating of the substrate.

FIG. 3 illustrates an application of the double zone deposition process to the fabrication of semiconductor devices. The device structure is shown at four stages of the processing in FIG. 3. The starting material is P-type silicon which may be in the form of a wafer. Suitable methods for preparing such wafers are well-known in the semiconductor art and will not be described here because they form no part of the present invention. One or more such silicon wafers are placed in the deposition zone 12 of the system illustrated in FIG. 1, and a continuous glass film is formed on one side of each wafer by pyrolysis of an organic silicate material such as tetramethylorthosilicate as described above. A typical glass coated wafer at this stage of the processing is illustrated in FIG. 3 (stage 1). The wafer 31 has a continuous film of glass 32 on its surface, and the glass 32 is pure silicon dioxide.

A portion of the glass film 32 is removed from the wafer by first covering the remainder of the film with resist material and then etching the exposed area with a suitable etching agent such as hydrofluoric acid. Those portions of the glass which are to remain on the wafer are protected by the resist material during the etching, and the resist is removed after the etching. The resulting structure is shown at stage 2 of FIG. 3.

Doping material is then diffused into the wafer at the portion 33 which is not protected by the glass 32. The glass prevents the doping material from diffusing into the remainder of the wafer, and thus serves as a diffusion mask. The diffusion step may be carried out in an ordinary diffusion furnace with an atmosphere of hydrogen containing a controlled amount of diffusant vapor such as phosphorus, for example. The resulting structure is shown at stage 3 of FIG. 3, and it may be seen from this that the phosphorous material which diffuses into the wafer forms an N-type region at 34 and a rectifying junction which is represented schematically by the dashed line 35. An ohmic contact 36 is formed on the N-type region 34, and this may be accomplished by vapor depositing aluminum, gold or other suitable material onto the wafer. A connecting wire 37 is bonded to the contact 36.

The device structure shown at stage 3 of FIG. 3 may be encapsulated with glass in the system of FIG. 1, and the resulting encapsulated structure is shown at stage 4 of FIG. 3. The glass film 38 covers the N-type region 34 and the ohmic connection formed by the contact 36 and the connecting wire 37, and thus completely seals the device within a protective glass film. A suitable mounting structure is provided for the semiconductor body 31, and this structure also serves to form an ohmic connection to the P-type material.

The device illustrated in FIG. 3 is a semiconductor diode, but transistor devices may be fabricated in essentially the same way. Such a transistor structure 41 is illustrated in FIG. 4. The transistor 41 has a diffused emitter region 42 and a diffused base region 46. There is an emitter contact 42′ and a base contact 44. Leads 43 and 45 are connected respectively to the emitter contact 42 and the base contact 44. The emitter region 42 and the base region 46 are formed by diffusion and masking techniques in the manner described above in connection with FIG. 3, and the collector region 47 is formed by the original semiconductor material. The glass material 48 completely encapsulates the device and protects it from the environment about it, particularly from moisture in that environment.

Suitable apparatus for carrying out the double zone deposition processing of the invention is illustrated in FIGS. 5, 6 and 7. The apparatus includes a vacuum chamber 51 formed by a bell jar 52 on a base-plate or platform 53. The device which is to be coated with glass is supported at a deposition zone 11 (FIG. 5), and this may be accomplished in the manner shown in FIG. 6. A semiconductor device 54 is supported by a bracket 55 over a tube 56 which is part of the pyrolysis zone of the system. The tube 56 is heated by a resistance heating element 57, and the temperature of the tube is controlled by a power supply unit 58 which is connected to the heater through the rods 59 and the conductive arms 60. The heating element 57 is covered with insulation material 61, and a radiation shield 62 is provided around the tube 56 by a metal housing. Gas containing the vapors to be pyrolyzed flows into the pyrolysis tube 56 through an inlet 63 which passes through the base 53 of the vacuum chamber. The radiation shield 62 may be cooled by providing a cooling coil which carries water as shown at 63 in FIG. 5.

Referring to FIG. 5, an inert carrier gas such as argon is introduced into the system through a blocking valve 64, and the flow rate of the carrier gas is controlled by a metering valve 66, and a "Rotameter" 65. The carrier gas stream is dried in drying tubes 67 which contain desiccant material, and flows from the drying tubes into the vaporizer 13. The pressure in the vaporizer 13 is measured with a mercury manometer 68 which is coupled to the inlet line of the vaporizer through a liquid trap 69.

Any suitable vaporizing equipment may be used, and a laboratory-type vaporizer is illustrated in FIG. 7. The vaporizer includes a glass tube 71 with an inlet for the carrier gas at 72 and an outlet for the carrier gas and silicate vapors at 73. Organic-silicate material in liquid form is metered into the tube 71 from a syringe-like device 74 which has a plunger 75 and a needle 76 for injecting drops of the liquid material into the tube at a controlled rate.

The vaporizer 13 is heated to a temperature of about 200° C. to vaporize the organic-silicate material, and the vapors flow with the carrier gas through a heated tube 77 (see FIG. 5) to the inlet tube 63 which leads to the pyrolysis zone (see FIG. 6). The flow rate of the vapor containing carrier gas is controlled by adjusting the metering valve 78 (FIG. 5).

For pyrolysis of the organic-silicate materials listed above, the temperature within the tube 56 is maintained at about 600° C.–800° C., and this corresponds to about 600 watts of power supplied by the unit 58. For a substrate of semi-conductor material, the substrate temperature is maintained below 150° C. The pressure within the vacuum chamber 51 is maintained at about three to five millimeters of mercury by means of the vacuum pump 18. Typically, the rate of deposition of the glass is two to twenty-five microns per hour.

It may be seen from the foregoing description that the invention provides an advantageous way of forming glass films or films of other inorganic materials on electronic substrate without permanently changing its electrical characteristics. The material of the substrate is not consumed during the processing, and this is advantageous as compared to methods of forming glass films by oxidation of material at the surface of a substrate. The invention is particularly useful in the encapsulation of solid state electronic devices with glass, and can also be used for device fabrication purposes where a glass film is required.

What is claimed is:

1. A process for coating a substrate with metallic oxide material including the steps of heating with heating means, vapors of a heat decomposable organic compound containing the metallic component of the oxide to an elevated temperature above 600° and sufficient to pyrolytically decompose said compound and form said oxide while maintaining said vapors separated from the heating means and substantially free of contamination therefrom, passing the heated oxide vapors to a cooler zone containing the substrate, and subjecting said substrate to said heated oxide vapors while maintaining said substrate at a temperature substantially below that of said oxide vapors whereby a metallic oxide coating is formed on said substrate.

2. A process for coating a substrate with metallic oxide material including the steps of heating with heating means, vapors of a heat decomposable organic compound containing the metallic component of the oxide to an elevated temperature above 600° C. and sufficient to pyrolytically decompose said compound and form said oxide, maintaining said oxide vapors separated from the heating means and substantially free of contamination therefrom, passing the heated oxide vapors into a zone maintained at a temperature below that of said heated vapors, and subjecting a substrate within said cooler zone to said heated oxide vapors while maintaining said substrate at a temperature below about 150° C. whereby a metallic oxide coating is formed on said substrate.

3. A process for coating a substrate with silicon dioxide including the steps of heating with heating means, a gaseous mixture comprising a carrier gas and vapors of a heat-decomposable silicon compound to an elevated temperature above 600° C. and sufficient to pyrolytically decompose said compound to silicon oxide vapors, maintaining the silicon oxide vapors separated from the heating means and substantially free of contamination therefrom, passing the heated silicon oxide vapors into a zone maintained at a temperature substantially below that of said heated vapors, and subjecting a substrate to said silicon oxide vapors while maintaining said substrate at a temperature below about 150° C. whereby a metallic oxide coating is formed on said substrate.

4. A process for coating a substrate with metallic oxide material including the steps of heating with heating means, vapors of a heat-decomposable orthoester compound of the metallic component of the oxide to an elevated temperature above 600° C. and sufficient to pyrolytically decompose said orthoester to said metallic oxide and volatile organic by-products, maintaining said oxide vapors separated from the heating medium and substantially free of contamination therefrom, and passing the heated oxide vapors over the surface of the substrate while maintaining said substrate at a temperature below about 150° C. whereby a metallic oxide coating is formed on said substrate.

5. The process of claim 4 in which the orthoester compound is tetramethylorthosilicate.

6. The process of claim 4 in which the orthoester compound is dibenzyldiethylorthosilicate.

7. The process of claim 4 in which the orthoester compound is diethyldimethylorthosilicate.

8. A process for coating a substrate with metallic oxide material including the steps of forming vapors of a decomposable organic compound containing the metallic component of the oxide, heating with heating means, said vapors to an elevated temperature above 600° C. and sufficient to pyrolytically decompose said compound and form said oxide, maintaining said compound separated from the heating means and substantially free of contamination therefrom, passing the heated oxide vapors to a cooler zone containing the substrate, and subjecting said substrate to said heated oxide vapors while maintaining said substrate at a temperature substantially below that of said oxide vapors whereby a metallic oxide coating is formed on said substrate.

9. A process for coating a substrate with metallic oxide material including the steps of passing an inert carrier gas in contact with a heat-decomposable organic compound containing the metallic component of the oxide, forming a gaseous mixture of said compound and said gas, heating in a first zone with heating means positioned adjacent thereto, to an elevated temperature above 600° C. and sufficient to pyrolytically decompose said compound and form said oxide, maintaining said gaseous oxide mixture separated from the heating means and substantially free of contamination therefrom, passing the heated oxide mixture to a second zone maintained at a temperature below that of said mixture, subjecting a substrate disposed in said second zone to the action of said oxide mixture while maintaining said substrate at a temperature below about 150° C. whereby a substantially moisture-free metallic oxide coating is formed on said substrate.

10. A process for coating a semiconductor with silicon dioxide material including the steps of passing an inert carrier gas in contact with a heat-decomposable organic silicon compound, forming a gaseous mixture of said silicon compound and said gas, heating in a first zone with heating means positioned adjacent thereto, the resulting gaseous mixture to a temperature above 600° C. and sufficient to pyrolytically decompose said silicon compound and form a silicon oxide, maintaining said gaseous oxide mixture separated from the heating means and substantially free of contamination therefrom, passing the heated oxide mixture to a second zone maintained at a temperature below that of said mixture, subjecting a substrate disposed in said second zone to the action of said oxide mixture while maintaining said substrate at a temperature below about 150° C. whereby a substantially moisture-free silicon dioxide coating is formed on said substarte.

11. The process of claim 10 in which the silicon compound is tetramethylorthosilicate.

12. The process of claim 10 in which the silicon compound is dibenzyldiethylorthosilicate.

13. The process of claim 10 in which the silicon compound is diethyldimethylorthosilicate.

References Cited

UNITED STATES PATENTS

| | | | |
|---|---|---|---|
| 2,272,342 | 2/1942 | Hyde | 65—18 X |
| 2,881,566 | 4/1959 | Badger | 117—106 X |
| 3,055,776 | 9/1962 | Stevenson et al. | 117—106 X |
| 3,089,793 | 5/1963 | Jordan et al. | 117—106 X |

ALFRED L. LEAVITT, *Primary Examiner.*

WILLIAM L. JARVIS, *Examiner.*